US008860518B1

(12) United States Patent
Abuelma'atti et al.

(10) Patent No.: US 8,860,518 B1
(45) Date of Patent: Oct. 14, 2014

(54) CURRENT-FEEDBACK OPERATIONAL-AMPLIFIER BASED RELAXATION OSCILLATOR

(71) Applicant: King Fahd University of Petroleum and Minerals, Dhahran (SA)

(72) Inventors: Muhammad Taher Abuelma'atti, Dhahran (SA); Zainulabideen Jamal Khalifa, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/162,339

(22) Filed: Jan. 23, 2014

(51) Int. Cl.
*H03K 7/00* (2006.01)
*H03K 3/0231* (2006.01)

(52) U.S. Cl.
CPC .................. *H03K 3/0231* (2013.01)
USPC ............................. 331/153; 331/111; 331/143

(58) Field of Classification Search
USPC .......... 331/36 C, 108 B, 108 C, 111, 143, 153
See application file for complete search history.

(56) References Cited

U.S. PATENT DOCUMENTS

| 4,115,748 A * | 9/1978 | Kubo et al. ............... 331/111 |
| 5,438,292 A * | 8/1995 | Tadokoro .................. 327/206 |
| 8,188,773 B1 * | 5/2012 | Abuelma'atti ............. 327/134 |

OTHER PUBLICATIONS

Martin Janecek, et al., "Voltage-Controlled Square/Triangular Wave Generator with Current Conveyors and Switching Diodes", Dec. 2012, (4 pages).
Shahram Minaei, et al., "A Simple Schmitt Trigger Circuit with Grounded passive Elements and It's Application to Square/Triangular Wave Generator", Jun. 2012, Circuts, Systems, and Signal Processing, vol. 31, Issue 3 (4 pages).

* cited by examiner

*Primary Examiner* — Joseph Chang
*Assistant Examiner* — Jeffrey Shin
(74) *Attorney, Agent, or Firm* — Oblon, Spivak, McClelland, Maier & Neustadt, L.L.P.

(57) ABSTRACT

A current-feedback operational-amplifier Based Relaxation oscillator provides oscillation based on a current feedback operation amplifier and two external resistors which exhibit a low output impedance terminal. This current-feedback operational-amplifier Based oscillator is used as a component for a capacitive, resistive and capacitive-resistive sensor electronic interfacing circuit.

7 Claims, 9 Drawing Sheets

CURRENT-FEEDBACK OPERATIONAL-AMPLIFIER BASED RELAXATION OSCILLATOR

BACKGROUND

1. Field of the Disclosure

The exemplary implementations described herein relate to a current-feedback operational-amplifier based relaxation oscillator as a versatile electronic interface for capacitive and resistive sensors.

2. Description of the Related Art

Oscillators are widely used as electronic interface for sensors. This is attributed to their simplicity and immunity to electromagnetic interference. While harmonic oscillators, widely used for capacitive and inductive sensors, have a very high sensitivity, due to their resonant nature, relaxation oscillators are simpler and less sensitive. This explains the growing interest in designing relaxation oscillations using operational amplifiers, operational transconductance amplifiers, second-generation current-conveyors and current feedback operational amplifiers (CFOAs). Of particular interest here is the relaxation oscillators built around CFOAs. This is attributed to their higher signal bandwidths, greater linearity, wider dynamic range, simple circuitry and low power consumption.

Inspection of the available current-conveyor based relaxation oscillators shows that a Schmitt trigger is required for each circuit implementation. While some implementations use current-in current-out Schmitt triggers others use the input-voltage output-voltage Schmitt trigger shown in FIG. 1 and described in Cataledo et al., ("A Schmitt trigger by means of a CCII+, International Journal of Circuit Theory and Applications, Vol. 23, 1995, pp. 161-165-incorporated herein by reference). Inspection of FIG. 1 shows that this Schmitt trigger circuit requires three resistors and does not have a low-output impedance terminal. Moreover, using this Schmitt trigger circuit a relaxation oscillator was proposed in Almashary et al., ("Current-mode triangular wave generator using CCIIs", Microelectronics Journal, Vol. 31, 2000, pp. 239-243-incorporated herein by reference) with the resistance R replaced by the internal parasitic resistance $r_x$ of the second-generation current conveyor; as shown in FIG. 2. Thus, cascading the relaxation oscillator circuit, based on FIG. 1, for further signal processing, may require an impedance matching circuit.

Furthermore, the relaxation oscillator reported in Almashary et al., ("Current-mode triangular wave generator using CCIIs", Microelectronics Journal, Vol. 31, 2000, pp. 239-243-incorporated herein by reference) was used as the basis for designing a current-conveyor based relaxation oscillator versatile electronic interface for capacitive and resistive sensors as described in Abuelma'atti et al., ("A current conveyor-based relaxation oscillator as a versatile electronic interface for capacitive and resistive sensors," International Journal of Electronics, Vol. 92, 2005, pp. 473-477—incorporated herein by reference). In the interface circuit of the parasitic resistance $r_x$ is used for deciding the frequency of oscillation of the relaxation oscillator. While the resistance $r_x$ is relatively small its value is not constant. Thus, the operation of the electronic interface reported in Abuelma'atti et al., ("A current conveyor-based relaxation oscillator as a versatile electronic interface for capacitive and resistive sensors," International Journal of Electronics, Vol. 92, 2005, pp. 473-477—incorporated herein by reference) may not be reliable.

SUMMARY

One embodiment of the disclosure includes a current-feedback operational-amplifier based serial resistive/serial capacitive/capacitive-resistive sensor electronic interfacing circuit system, including: a first output terminal; a serial resistive/serial capacitive/capacitive-resistive sensor having a first terminal and a second terminal; a reference capacitor directly coupled between the first terminal of the serial resistive/serial capacitive/capacitive-resistive sensor and a ground; a current-feedback operational-amplifier based Schmitt trigger circuit including: a first input terminal directly coupled to the second terminal of the serial resistive/serial capacitive/capacitive-resistive sensor; a second output terminal directly coupled to the first output terminal of the serial resistive/serial capacitive/capacitive-resistive sensor; a current feedback operational amplifier having a second input terminal, a third input terminal, a third output terminal and a fourth output terminal, wherein the third output terminal directly coupled to the first output terminal of the current-feedback operational-amplifier based serial resistive/serial capacitive/capacitive-resistive sensor electronic interfacing circuit system, and the fourth output terminal directly coupled to the third input terminal; a first resistor directly coupled between the first input terminal and the second input terminal, and a second resistor directly coupled between the third input terminal and a ground.

Another embodiment of the disclosure includes a current-feedback operational-amplifier based parallel capacitive sensor electronic interfacing circuit system, comprising: a first output terminal; a parallel capacitive sensor having a first terminal and a second terminal, wherein the second terminal directly coupled to a ground; a reference capacitor directly coupled between the first terminal of the parallel capacitive sensor and the ground; a current-feedback operational-amplifier based Schmitt trigger circuit including: a first input terminal directly coupled to the first terminal of the parallel capacitive sensor; a second output terminal, directly coupled to the first output terminal of the current-feedback operational-amplifier based parallel capacitive sensor electronic interfacing circuit system; a current feedback operational amplifier having a second input terminal, a third input terminal, a third output terminal and a fourth output terminal, wherein the third output terminal directly coupled to the first output terminal of the current-feedback operational-amplifier based parallel capacitive sensor electronic interfacing circuit system, and the fourth output terminal directly coupled to the third input terminal; a first resistor directly coupled between the first input terminal of the current-feedback operational-amplifier based Schmitt trigger circuit and the second input terminal, and a second resistor directly coupled between the third input terminal and a ground.

A further embodiment of the disclosure includes a current-feedback operational-amplifier based Schmitt trigger circuit including: a first input terminal; a first output terminal; a current feedback operational amplifier having a second input terminal, a third input terminal, a second output terminal and a third output terminal, wherein the second output terminal directly coupled to the first output terminal, and the third output terminal directly coupled to the third input terminal; a first resistor directly coupled between the first input terminal and the second input terminal; a second resistor directly coupled between the third input terminal and a ground.

DETAILED DESCRIPTION OF THE PRESENT EMBODIMENTS

The present embodiment is a Current-Feedback Operational-Amplifier Based Relaxation Oscillator (CFOA)-based Schmitt trigger circuit that uses only two resistors and enjoys a low impedance output terminal. The use of the proposed Schmitt trigger circuit in designing a reliable electronic interface for capacitive, resistive or capacitive-resistive sensors is presented.

Figure 3:
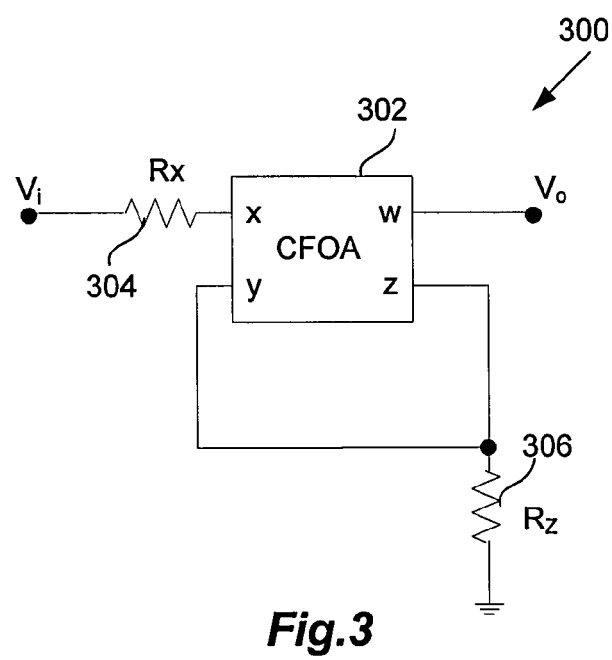
FIG. 3 is a schematic drawing of a proposed current-feedback operational-amplifier based Schmitt Trigger.
Figure 4:
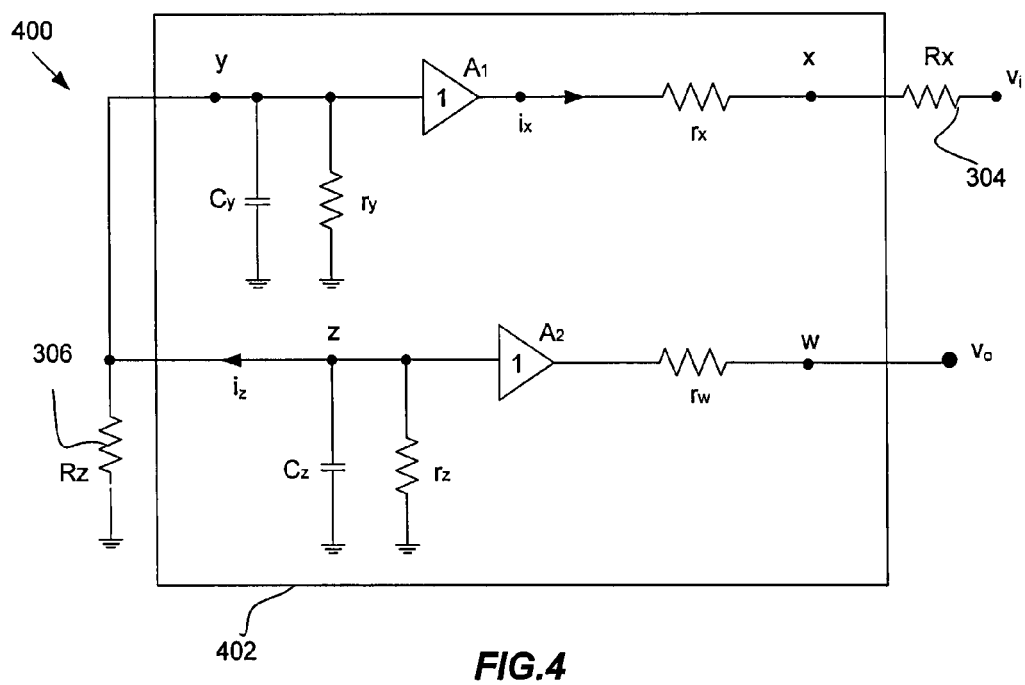
FIG. 4 is a schematic diagram of the proposed equivalent circuit of the current-feedback operational-amplifier based Schmitt Trigger.

A current-feedback operational amplifier (CFOA) based relaxation oscillator 300, as shown in FIG. 3, includes a CFOA 302, an external resistor $R_X$ 304 connected between the CFOA x input and oscillator input Vi, and an external resistor $R_Z$ 306 connected between the y and z terminals of the CFOA 302. In FIG. 3, x and y are differential inputs to the CFOA 302, and w is the output pin. The equivalent circuit of this oscillator structure is shown in FIG. 4, wherein the dotted box represents a simplified equivalent circuit for the CFOA 302. In this equivalent circuit, $r_x$ and $r_w$ represent the output resistances of the unity-gain buffers $A_1$ and $A_2$, respectively; $C_z$ is the internally connected compensation capacitor; $R_z$ is the internal resistance of the gain node; and $C_y$ and $R_y$ represent the input impedance at terminal y of the CFOA.

In FIG. 3 the resistance $R_X$ is an externally connected resistance with $R_X \gg r_x$ where $r_x$ is the parasitic internal resistance at terminal x of the CFOA. The output of the Schmitt trigger of FIG. 3 will switch between its maximum, $V_{sat+}$, and minimum, $V_{sat-}$, when the input voltage, $V_i$, reaches the following two threshold voltages as described in equation (1) and (2):

$$V_{th+} = \frac{R_Z - R_X}{R_Z} V_{sat+} \quad (1)$$

$$V_{th-} = \frac{R_Z - R_X}{R_Z} V_{sat-} \quad (2)$$

Considering the circuit of FIG. 5 with nodes 1 and 2 connected and the sensor disconnected. Assume that the capacitor $C_r$ has an initial voltage=$V_{th-}$, and is charging through the resistance $R_X$ heading towards $V_{sat+}$. The voltage across the capacitor can be described as:

$$V_{C_r}(t) = V_{sat+} - (V_{sat+} - V_{th-})\exp(-t/C_r R_X) \quad (3)$$

The capacitor will continue charging until its voltage reaches $V_{th+}$ when the output voltage of the CFOA switches to $V_{sat-}$ and the process will be reversed. Using equation (3), the time $T_1$ required to charge the capacitor from $V_{th-}$ to $V_{th+}$ will be given by:

$$T_1 = C_r R_X \ln\left(\frac{V_{sat+} - V_{th-}}{V_{sat+} - V_{th+}}\right) \quad (4)$$

When the capacitor voltage reaches $V_{th+}$ the output voltage of the CFOA switches to $V_{sat-}$ and the capacitor starts a charging process heading towards $V_{sat-}$. The voltage across the capacitor can be described as:

$$V_{C_r}(t) = V_{sat-} - (V_{sat-} - V_{th+})\exp(-t/C_r R_X) \quad (5)$$

The capacitor will continue charging until its voltage reaches $V_{th-}$ when the output voltage of the CFOA switches to $V_{sat+}$ and the process will be reversed. Using equation (5), the time $T_2$ required to charge the capacitor from $V_{th+}$ to $V_{th-}$ will be given by:

$$T_2 = C_r R_X \ln\left(\frac{V_{sat-} - V_{th+}}{V_{sat-} - V_{th-}}\right) \quad (6)$$

When the voltage across the capacitor reaches $V_{th-}$ the output voltage of the CFOA switches to $V_{sat+}$ and the process will be repeated. Using equations (4) and (6) the duration of the resulting oscillation period will be given by $$T = T_1 + T_2 = \frac{1}{f} = C_r R_X \ln\left(\frac{V_{sat+} - V_{th-} V_{sat-} - V_{th+}}{V_{sat+} - V_{th+} V_{sat-} - V_{th-}}\right) \quad (7)$$

Inspection of equations (1), (2), (4) and (6) clearly shows that a square-wave with duty cycle different from 50% can be obtained by proper selection of $V_{sat+}$ and $V_{sat-}$.

Combining equations (1), (2) and (7) yields $$T = T_1 + T_2 = \quad (8)$$
$$\frac{1}{f} = C_r R_X \ln\left(\left(\frac{R_Z}{R_X} - \frac{R_Z - R_X}{R_X}\frac{V_{sat-}}{V_{sat+}}\right)\left(\frac{R_Z}{R_X} - \frac{R_Z - R_X}{R_X}\frac{V_{sat+}}{V_{sat-}}\right)\right)$$

For the special case with $V_{sat-}=V_{sat+}$ equation (8) reduces to $$T = T_1 + T_2 = \frac{1}{f} = C_r R_X \ln\left(\frac{2R_Z}{R_X} - 1\right) \quad (9)$$

Figure 5A:
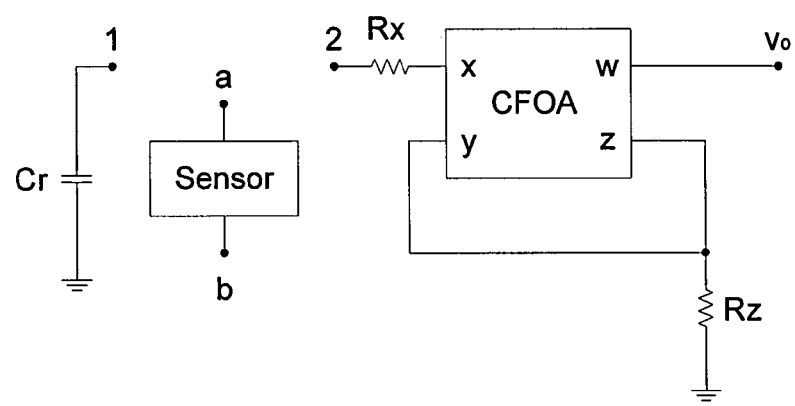
FIG. 5A is a schematic drawing of a proposed current-feedback operational-amplifier based capacitive/resistive sensor electronic interfacing circuit.
Figure 5B:
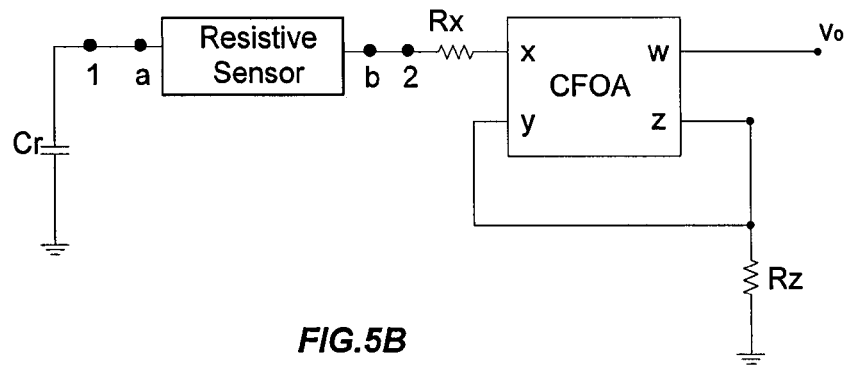
FIG. 5B is a schematic drawing of a proposed current-feedback operational-amplifier based serial resistive sensor electronic interfacing circuit.

In the proposed CFOA-based capacitive/resistive sensor electronic interfacing circuit shown in FIG. 5A the dotted box can be:

For case (a), as shown in FIG. 5B, a resistive sensor with resistance $R_s$ connected in series with the reference capacitance $C_r$; that is with terminal a connected to terminal 1 and terminal b connected to terminal 2. In this case the resistance $R_X$ in equations (8) and (9) will be replaced by $R_{ST}=R_s+R_X$, and the oscillation period of serial resistive sensor network can be described as:

$$T = T_1 + T_2 = \tag{10}$$
$$\frac{1}{f} = C_r R_{ST} \ln\left(\left(\frac{R_Z}{R_{ST}} - \frac{R_Z - R_{ST}}{R_{ST}}\frac{V_{sat-}}{V_{sat+}}\right)\left(\frac{R_Z}{R_{ST}} - \frac{R_Z - R_{ST}}{R_{ST}}\frac{V_{sat+}}{V_{sat-}}\right)\right)$$

For the special case with $V_{sat-}=-V_{sat+}$ equation (10) reduces to $$T = T_1 + T_2 = \frac{1}{f} = 2C_r R_{ST} \ln\left(\frac{2R_Z}{R_{ST}} - 1\right) \tag{11}$$

Figure 5C:
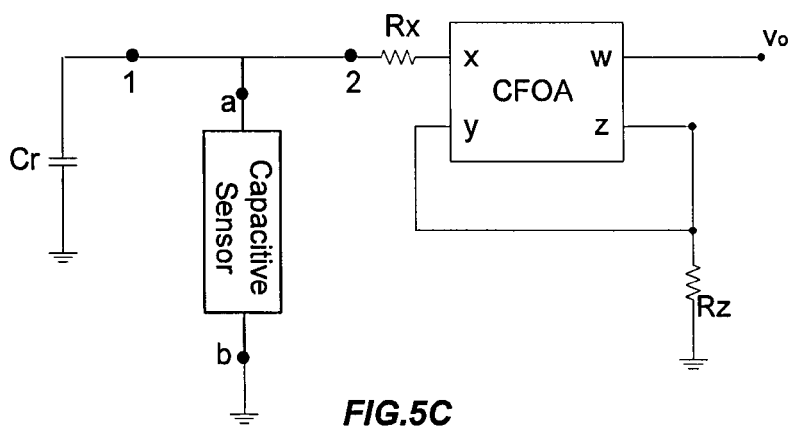
FIG. 5C is a schematic drawing of a proposed current-feedback operational-amplifier based parallel capacitive sensor electronic interfacing circuit.

For case (b), as shown in FIG. 5C, a capacitive sensor with capacitance $C_s$ connected in parallel with the reference capacitor $C_r$; that is with terminal a connected to terminal 1 and terminal 2 and terminal b connected to the ground. In this case the capacitance $C_r$ in equations (8) and (9) will be replaced by $C_{PT}=C_r+C_s$ and the oscillation period of parallel capacitive sensor network is described as:

$$T = T_1 + T_2 = \tag{12}$$
$$\frac{1}{f} = C_{PT} R_X \ln\left(\left(\frac{R_Z}{R_X} - \frac{R_Z - R_X}{R_X}\frac{V_{sat-}}{V_{sat+}}\right)\left(\frac{R_Z}{R_X} - \frac{R_Z - R_X}{R_X}\frac{V_{sat+}}{V_{sat-}}\right)\right)$$

For the special case with $V_{sat-}=-V_{sat+}$ equation (12) reduces to $$T = T_1 + T_2 = \frac{1}{f} = 2C_{PT} R_X \ln\left(\frac{2R_Z}{R_{ST}} - 1\right) \tag{13}$$

Figure 5D:
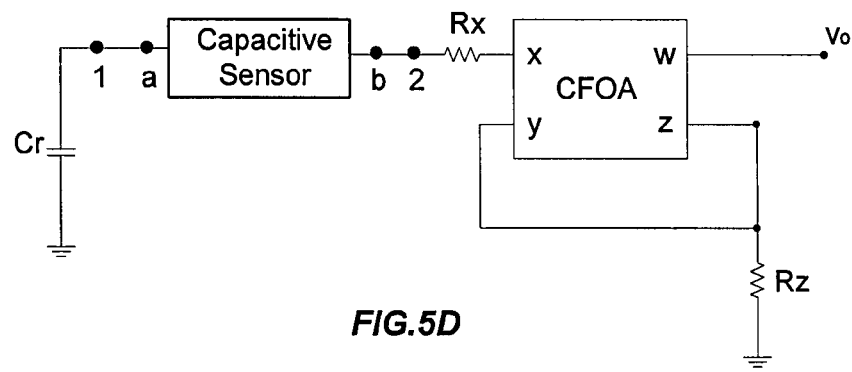
FIG. 5D is a schematic drawing of a proposed current-feedback operational-amplifier based serial capacitive sensor electronic interfacing circuit.

For case (c), as shown in FIG. 5D, a capacitive sensor with capacitance $C_s$ connected in series with the reference capacitor $C_r$; that is with terminal a connected to terminal 1 and terminal b connected to terminal 2. In this case the capacitance $C_r$ in equations (8) and (9) will be replaced by $C_{ST} \cong C_r C_s/(C_r+C_s)$ and the oscillation period of serial capacitive sensor network is described as:

$$T = T_1 + T_2 = \tag{14}$$
$$\frac{1}{f} = C_{ST} R_X \ln\left(\left(\frac{R_Z}{R_X} - \frac{R_Z - R_X}{R_X}\frac{V_{sat-}}{V_{sat+}}\right)\left(\frac{R_Z}{R_X} - \frac{R_Z - R_X}{R_X}\frac{V_{sat+}}{V_{sat-}}\right)\right)$$

For the special case with $V_{sat-}=-V_{sat+}$ equation (14) reduces to $$T = T_1 + T_2 = \frac{1}{f} = 2C_{ST} R_X \ln\left(\frac{2R_Z}{R_X} - 1\right) \tag{15}$$

Figure 5E:
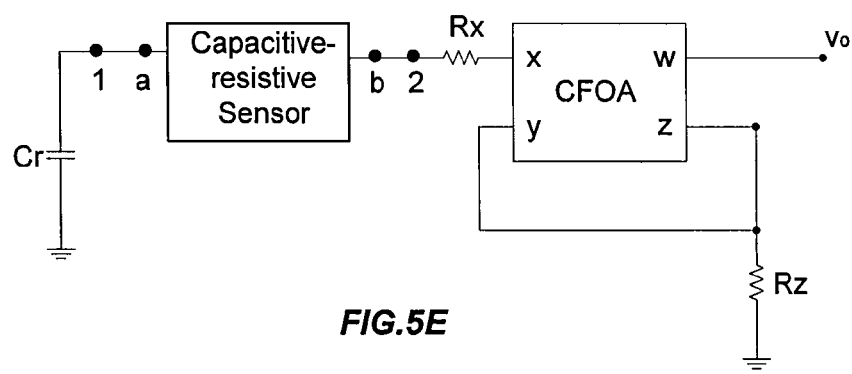
FIG. 5E is a schematic drawing of a proposed current-feedback operational-amplifier based serial capacitive-resistive sensor electronic interfacing circuit.

For case (d), as shown in FIG. 5E, a capacitive-resistive sensor with capacitance $C_s$ and resistance connected $R_s$ in series with the reference capacitor $C_r$; that is with terminal a connected to terminal 1 and terminal b connected to terminal 2. In this case the capacitance $C_r$ and the resistance $R_X$ in equations (8) and (9) will be replaced by $C_T \cong C_r C_s/(C_r+C_s)$ and $R_T \cong R_X+R_S$ respectively, and the oscillation period of capacitive-resistive sensor network is described as:

$$T = T_1 + T_2 = \tag{16}$$
$$\frac{1}{f} = C_T R_X \ln\left(\left(\frac{R_Z}{R_T} - \frac{R_Z - R_T}{R_T}\frac{V_{sat-}}{V_{sat+}}\right)\left(\frac{R_Z}{R_T} - \frac{R_Z - R_T}{R_T}\frac{V_{sat+}}{V_{sat-}}\right)\right)$$

For the special case with $V_{sat-}=-V_{sat+}$ equation (16) reduces to $$T = T_1 + T_2 = \frac{1}{f} = 2C_T R_X \ln\left(\frac{2R_Z}{R_T} - 1\right) \tag{17}$$

The approximations made in cases (a) and (d) are based on the assumptions that the time constant $C_x r_x \ll C_T R_s$.

Figure 1:
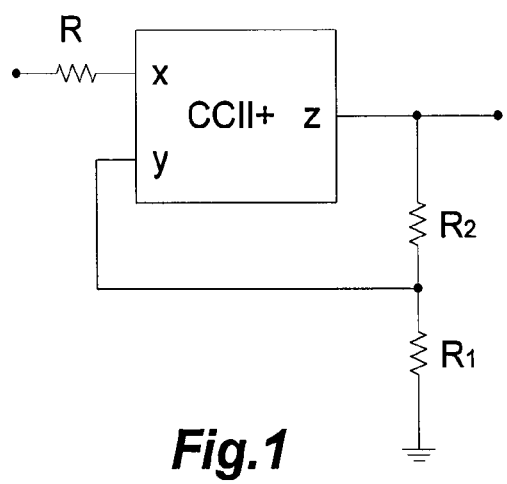
FIG. 1 is a schematic drawing of a CCII+ based Schmitt trigger circuit.
Figure 2:
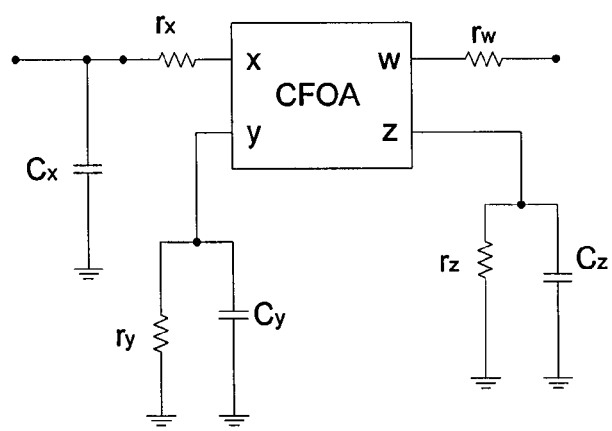
FIG. 2 is a schematic drawing of an AD844 current-feedback operational-amplifier.
Figure 6:
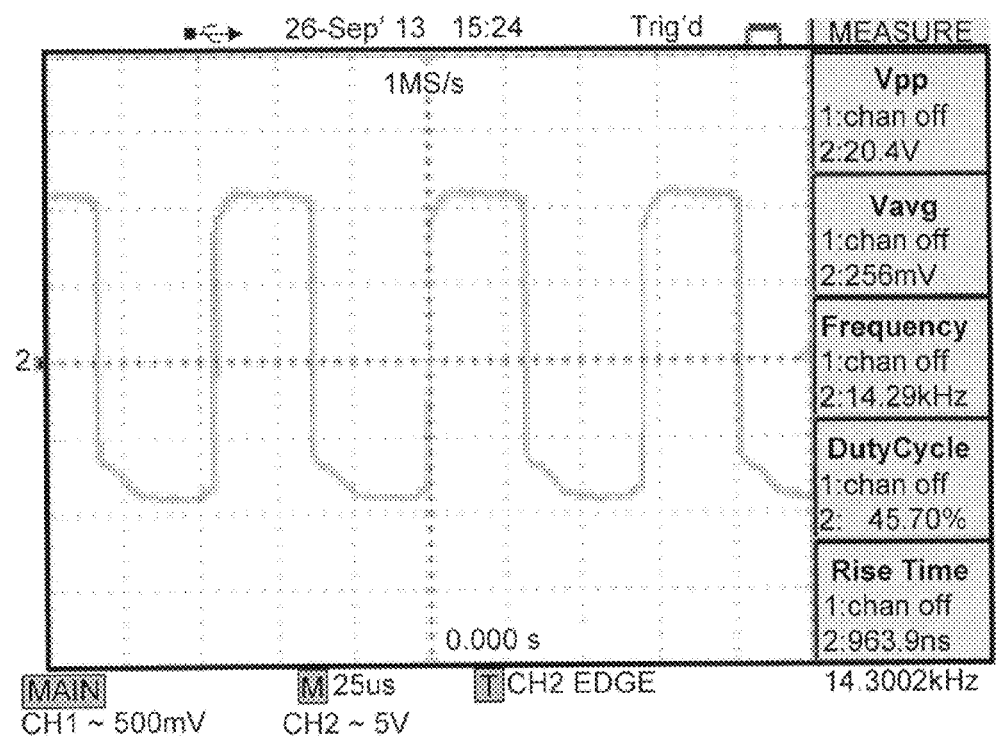
FIG. 6 is a plot of output waveform obtained from the FIG. 5A with $R_X$=10.0K, $R_Z$=1.0K and $C_r$=10.0 nF.
Figure 7:
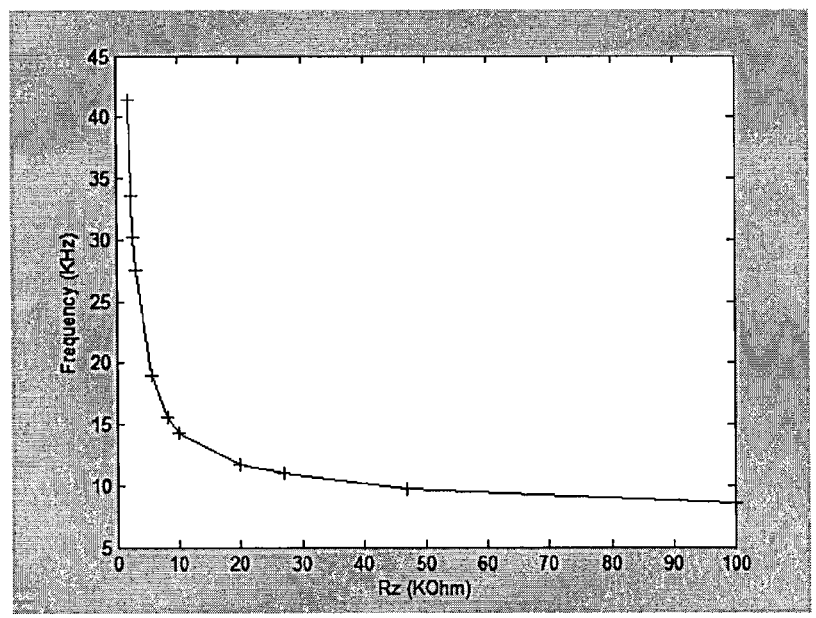
FIG. 7 is a plot of a variation of the output frequency of the circuit of FIG. 5A with the capacitance Rz at a condition that $R_X$=1.0K and $C_r$=10.0 nF.
Figure 8:
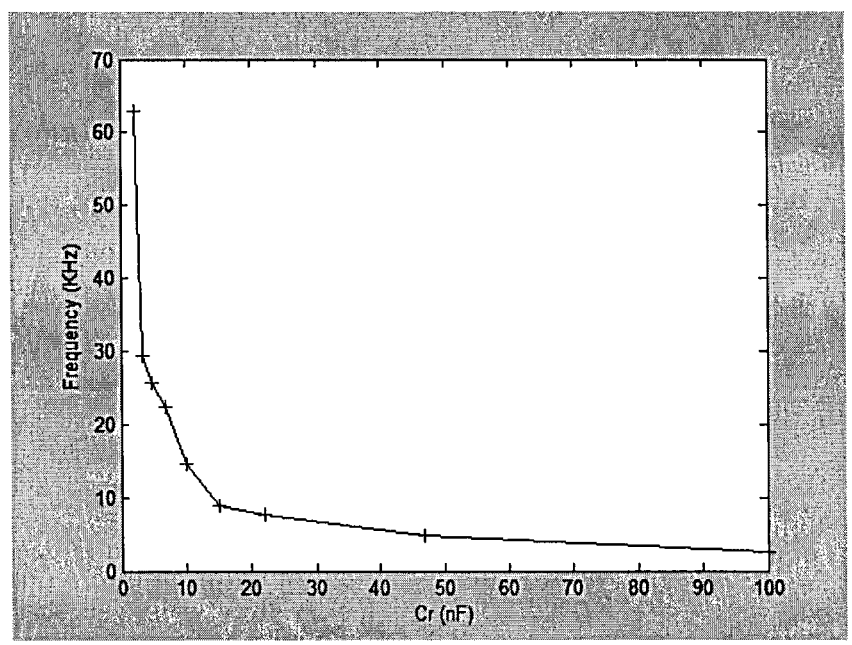
FIG. 8 is a plot of a variation of the output frequency of the circuit of FIG. 5A with the capacitance Cr at a condition that $R_Z$=10.0K and $R_X$=1.0K.

The proposed circuit of FIG. 5A was tested using the current-feedback operational-amplifier AD844 (Spice model available from Analog Device is shown in FIG. 2 using the following values of the components: $R_z \cong 3$, MΩ, $C_z \cong 4.5$ pF, $R_y \cong 10$ MΩ, $C_y \cong 2.0$ pF, and $r_x \cong 50\Omega$). By selecting $C_r=10$ nF and Rx=10 kΩ, then $R_Z=1.0$K, rectangular oscillations are obtained, as shown in plot of FIG. 6. The variations of the frequency of oscillation with the capacitance $C_r$ and the resistance $R_Z$ are shown in FIGS. 7 and 8. These results are obtained with DC supply voltage=±10V.

The invention claimed is:
1. A current-feedback operational-amplifier based serial resistive/serial capacitive/capacitive—resistive sensor electronic interfacing circuit system, comprising:
 a first output terminal;
 a serial resistive/serial capacitive/capacitive-resistive sensor having a first terminal and a second terminal;
 a reference capacitor directly coupled between the first terminal of the serial resistive/serial capacitive/capacitive-resistive sensor and a ground;
 a current-feedback operational-amplifier based Schmitt trigger circuit including:
 a first input terminal directly coupled to the second terminal of the serial resistive/serial capacitive/capacitive-resistive sensor;
 a second output terminal directly coupled to the first output terminal of the serial resistive/serial capacitive/capacitive-resistive sensor;
 a current feedback operational amplifier having a second input terminal, a third input terminal, a third output terminal and a fourth output terminal, wherein the third output terminal directly coupled to the first output terminal of the current-feedback operational-amplifier based serial resistive/serial capacitive/capacitive-resistive sensor electronic interfacing circuit system, and the fourth output terminal directly coupled to the third input terminal;

a first resistor directly coupled between the first input terminal and the second input terminal, and a second resistor directly coupled between the third input terminal and a ground.

2. The current-feedback operational-amplifier based serial resistive sensor electronic interfacing circuit system of claim 1, wherein a oscillation period of the serial resistive sensor electronic interfacing circuit system is calculated according to:

$$T = C_r R_{ST} \ln\left(\left(\frac{R_Z}{R_{ST}} - \frac{R_Z - R_{ST}}{R_{ST}} \frac{V_{sat-}}{V_{sat+}}\right)\left(\frac{R_Z}{R_{ST}} - \frac{R_Z - R_{ST}}{R_{ST}} \frac{V_{sat+}}{V_{sat-}}\right)\right)$$

where $V_{sat+}$ is a maximum output voltage of the Schmitt trigger circuit, $V_{sat-}$ is a minimum output voltage of the Schmitt trigger circuit, $R_X$ is a first resistance of the first resistor, $R_Z$ is a second resistance of the second resistor, $R_S$ is a third resistance of the serial resistivity sensor, $C_r$ is a first capacitance of the reference capacitance and $R_{ST} = R_s + R_X$.

3. The current-feedback operational-amplifier based serial capacitive electronic interfacing circuit system of claim 1, wherein a oscillation period of the serial capacitive sensor electronic interfacing circuit system is calculated according to:

$$T = C_{ST} R_X \ln\left(\left(\frac{R_Z}{R_X} - \frac{R_Z - R_X}{R_X} \frac{V_{sat-}}{V_{sat+}}\right)\left(\frac{R_Z}{R_X} - \frac{R_Z - R_X}{R_X} \frac{V_{sat+}}{V_{sat-}}\right)\right)$$

where $V_{sat+}$ is a maximum output voltage of the Schmitt trigger circuit, $V_{sat-}$ is a minimum output voltage of the Schmitt trigger circuit, $R_X$ is a first resistance of the first resistor, $R_Z$ is a second resistance of the second resistor, $C_r$ is a first capacitance of the reference capacitance, $C_s$ is a second capacitance of the serial capacitive sensor, and $C_{ST} \cong C_r C_s/(C_r + C_s)$.

4. The current-feedback operational-amplifier based serial capacitive-resistive sensor electronic interfacing circuit system of claim 1, wherein a oscillation period of the capacitive-resistive sensor electronic interfacing circuit system network is calculated according to:

$$T = C_T R_X \ln\left(\left(\frac{R_Z}{R_T} - \frac{R_Z - R_T}{R_T} \frac{V_{sat-}}{V_{sat+}}\right)\left(\frac{R_Z}{R_T} - \frac{R_Z - R_T}{R_T} \frac{V_{sat+}}{V_{sat-}}\right)\right)$$

where $V_{sat+}$ is a maximum output voltage of the Schmitt trigger circuit, $V_{sat-}$ is a minimum output voltage of the Schmitt trigger circuit, $R_X$ is a first resistance of the first resistor, $R_Z$ is a second resistance of the second resistor, $R_s$ is a third resistance of the capacitive-resistive sensor, $C_r$ is a first capacitance of the reference capacitance, $C_s$ is a second capacitance of the capacitive-resistive sensor, $C_T \cong C_r C_s/(C_r + C_s)$ and $R_T \cong R_X + R_s$.

5. A current-feedback operational-amplifier based parallel capacitive sensor electronic interfacing circuit system, comprising:

a first output terminal;

a parallel capacitive sensor having a first terminal and a second terminal, wherein the second terminal directly coupled to a ground;

a reference capacitor directly coupled between the first terminal of the parallel capacitive sensor and the ground;

a current-feedback operational-amplifier based Schmitt trigger circuit including:

a first input terminal directly coupled to the first terminal of the parallel capacitive sensor;

a second output terminal, directly coupled to the first output terminal of the current-feedback operational-amplifier based parallel capacitive sensor electronic interfacing circuit system;

a current feedback operational amplifier having a second input terminal, a third input terminal, a third output terminal and a fourth output terminal, wherein the third output terminal directly coupled to the first output terminal of the current-feedback operational-amplifier based parallel capacitive sensor electronic interfacing circuit system, and the fourth output terminal directly coupled to the third input terminal;

a first resistor directly coupled between the first input terminal of the current-feedback operational-amplifier based Schmitt trigger circuit and the second input terminal, and a second resistor directly coupled between the third input terminal and a ground.

6. The current-feedback operational-amplifier based parallel capacitive sensor electronic interfacing circuit system of claim 5, wherein a oscillation period of the parallel capacitive sensor electronic interfacing circuit system is calculated according to:

$$T = C_{PT} R_X \ln\left(\left(\frac{R_Z}{R_X} - \frac{R_Z - R_X}{R_X} \frac{V_{sat-}}{V_{sat+}}\right)\left(\frac{R_Z}{R_X} - \frac{R_Z - R_X}{R_X} \frac{V_{sat+}}{V_{sat-}}\right)\right)$$

where $V_{sat+}$ is a maximum output voltage of the Schmitt trigger circuit, $V_{sat-}$ is a minimum output voltage of the Schmitt trigger circuit, $R_X$ is a first resistance of the first resistor, $R_Z$ is a second resistance of the second resistor, $C_r$ is a first capacitance of the reference capacitance, $C_s$ is a second capacitance of the parallel capacitive sensor and $C_{PT} = C_r + C_s$.

7. A current-feedback operational-amplifier based Schmitt trigger circuit comprising:

a first input terminal;

a first output terminal;

a current feedback operational amplifier having a second input terminal, a third input terminal, a second output terminal and a third output terminal, wherein the second output terminal directly coupled to the first output terminal, and the third output terminal;

directly coupled to the third input terminal;

a first resistor directly coupled between the first input terminal and the second input terminal;

a second resistor directly coupled between the third input terminal and a ground.

* * * * *